United States Patent
Ginsburg et al.

(10) Patent No.: US 7,227,433 B2
(45) Date of Patent: Jun. 5, 2007

(54) ELECTRO MECHANICAL DEVICE HAVING A SEALED CAVITY

(75) Inventors: Eyal Ginsburg, Tel Aviv (IL); Alexander Talalyevsky, Jerusalem (IL); Eyal Bar-Sadeh, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 186 days.

(21) Appl. No.: 10/813,026

(22) Filed: Mar. 31, 2004

(65) Prior Publication Data

US 2005/0224900 A1 Oct. 13, 2005

(51) Int. Cl.
*H03H 9/54* (2006.01)
(52) U.S. Cl. .................. 333/187; 333/189; 310/324
(58) Field of Classification Search ............... 333/187, 333/189; 310/324
See application file for complete search history.

(56) References Cited

U.S. PATENT DOCUMENTS

| | | | | |
|---|---|---|---|---|
| 5,373,268 | A | * | 12/1994 | Dworsky et al. ............ 333/187 |
| 5,692,279 | A | * | 12/1997 | Mang et al. ............... 29/25.35 |
| 6,081,171 | A | * | 6/2000 | Ella ........................... 333/189 |
| 6,469,761 | B1 | * | 10/2002 | Drabik et al. .............. 349/122 |
| 6,509,813 | B2 | * | 1/2003 | Ella et al. .................. 333/187 |
| 6,657,363 | B1 | * | 12/2003 | Aigner ....................... 310/324 |
| 6,870,445 | B2 | * | 3/2005 | Kawakubo et al. ......... 333/187 |

| | | | |
|---|---|---|---|
| 2003/0047450 | A1 | 3/2003 | Yang et al. |
| 2004/0021191 | A1 | 2/2004 | Bradley |

OTHER PUBLICATIONS

Fukang J. et al., "A Flexible MEMS Technology and its First Applications to Shear Stress Sensor Skin", Micro Electro Mechanical Systems, 1997, MEMS 97, Proceedings, IEEE, Tenth Annual International Workshop on Nagoya, Japan, Jan. 26-30, 1997, New York, NY, USA, IEEE, pp. 465-470.

Lutsky J.J. et al., "A sealed cavity TFR process for RF bandpass filters", Electron Devices Meeting, 1996, International San Francisco, CA, USA, Dec. 8-11, 1996, New York, NY, USA, IEEE, USA, pp. 95-98.

International Search Report for PCT/US2005/006721, mailed on Jun. 29, 2005.

"IEEE Electron Device Letters", vol. 21, No. 12, Dec. 2000, 2 pages.

Kohl et al., "Air-gaps in 0.3 μm Electrical Interconnections", IEEE Electron Device Letters, vol. 21, No. 12, Dec. 2000, pp. 557-559.

Tsamis et al., "Fabrication of Suspended Porous Silicon Microhotplates for Thermal Sensor Applications", Porous Silicon Science and Technology Conference, PSST 2002, Mar. 10-15, 2002, Tenerife, Spain, pp. 1-13.

* cited by examiner

*Primary Examiner*—Barbara Summons
(74) *Attorney, Agent, or Firm*—Pearl Cohen Zedek Latzer, LLP

(57) ABSTRACT

Briefly, embodiments of the present invention provide an electro-mechanical device, for example, a Micro-Electro-Mechanical Systems (MEMS) device, for example, a low-loss Film Bulk Acoustic Resonators (FBAR) filter, and a process to produce the same.

18 Claims, 5 Drawing Sheets

ELECTRO MECHANICAL DEVICE HAVING A SEALED CAVITY

BACKGROUND OF THE INVENTION

Electro-mechanical devices, for example, Micro-Electro-Mechanical Systems (MEMS) devices may include ultra-small mechanical components.

Certain MEMS devices, for example, Film Bulk Acoustic Resonator (FBAR) Radio Frequency (RF) filters, may include a membrane attached to a substrate, for example, a Silicon substrate. One or more cavities may be formed in the substrate, for example, to allow freedom of movement of the membrane and/or to reduce loss of RF energy during operation.

A conventional process for producing such MEMS devices may include depositing the membrane and/or other layers on top of the substrate, and then forming the cavities in the substrate. Since access to the substrate is obscured by the membrane and/or other layers, release holes may be created in the device to allow injection of etching material to form the cavities in the substrate by a dry or wet-etching process.

Thus, the cavities may be fluidically connected, for example, via the release holes, with an environment surrounding the MEMS device, for example, before the MEMS device is packaged. This may result in contamination of the cavities and/or stiction of the membrane, i.e., the membrane sticking to the surface of the cavity, for example, as a result of the wet-etching process and/or due to environmental humidity.

Contamination of the cavities and/or stiction of the membrane may affect the operation of the MEMS device.

BRIEF DESCRIPTION OF THE DRAWINGS

The subject matter regarded as the invention is particularly pointed out and distinctly claimed in the concluding portion of the specification. The invention, however, both as to organization and method of operation, together with features and advantages thereof, may best be understood by reference to the following detailed description when read with the accompanied drawings in which:

Figure 1:
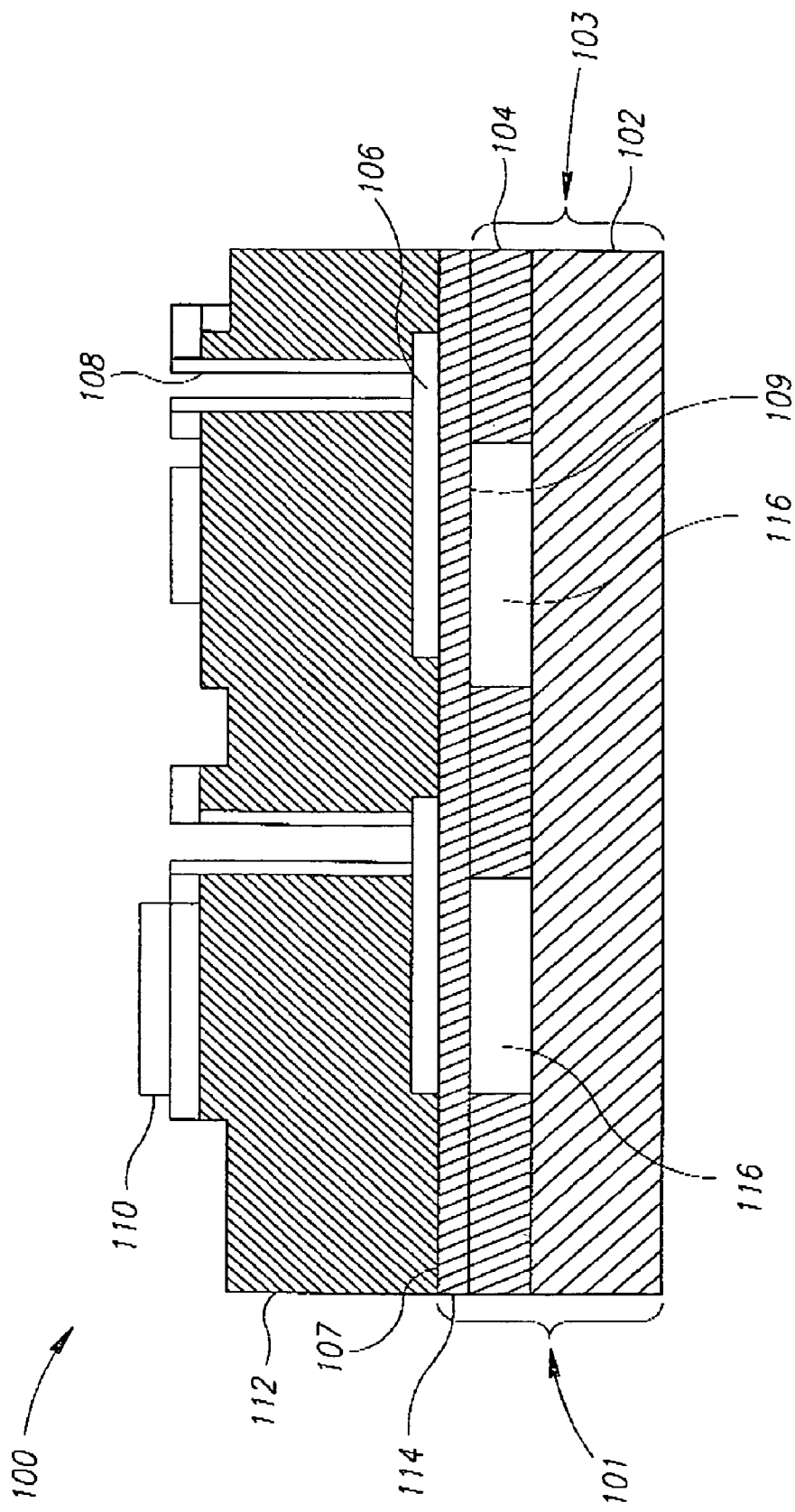
FIG. 1 is a schematic illustration of a Micro-Electro-Mechanical Systems (MEMS) device in accordance with exemplary embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits may not have been described in detail so as not to obscure the present invention.

Although some exemplary embodiments of the invention may refer to a Micro-Electro-Mechanical Systems (MEMS) device, it will be appreciated by those skilled in the art that aspects of the present invention may be applicable to any other electro-mechanical device, for example, a Nano-Electro-Mechanical Systems (NEMS) device.

Although the present invention is not limited in this regard, the term "MEMS device" as used herein may be understood to include, among other things, any suitable Micro-Electro-Mechanical Systems device, for example, a Film Bulk Acoustic Resonator (FBAR) filter, a FBAR Radio Frequency (RF) filter, a RF switch, a varactor, a tunable capacitor, or any other MEMS device where it may be relevant to apply the principles of the present invention. Although an exemplary embodiment of the present invention may include a FBAR RF filter, it is presented herein only as an example of applying the principles of the present invention to a MEMS device; the present invention is not limited in this regard, and its principles may be applied to other suitable MEMS devices.

It will be appreciated that the terms "top" and "bottom" may be used herein for exemplary purposes only, to illustrate the relative positioning or placement of certain components, and/or to indicate a first and a second component. The terms "top" and "bottom" as used herein do not necessarily indicate that a "top" component is above a "bottom" component, as such directions and/or components may be flipped, rotated, moved in space, placed in a diagonal orientation or position, placed horizontally or vertically, or similarly modified.

It will be appreciated that the term "sealed cavity" as used herein may refer to a cavity being isolated, i.e., fluidically disconnected, from an environment, for example, air surrounding an element containing the cavity, such that any contents of the sealed cavity may not be in direct contact with the environment.

Reference is made to FIG. 1, which schematically illustrates a MEMS device 100 in accordance with exemplary embodiments of the present invention.

According to some exemplary embodiments of the invention, device 100 may be used, for example, as a FBAR RF filter, as is known in the art. Device 100 may include a membrane 112 attached to a support structure 101 including at least one sealed cavity 116, as described in detail below.

According to some exemplary embodiments of the invention, device 100 may further include one or more bottom conductors 106 associated with membrane 112 and/or support structure 101. Device 100 may also include one or more top conductors 110 associated with membrane 112. Optionally, device 100 may include one or more wafer vias 108.

According to exemplary embodiments of the invention, support structure 101 may include a cap layer 114 having a first, for example, top, surface 107 attached to membrane 112 and a second, for example, bottom, surface 109 attached to a base structure 103. Sealed cavity 116 may be encapsulated between surface 109 and base structure 103.

According to some exemplary embodiments of the invention, base structure 103 may include two or more protrusions 104 attached to a base substrate 102 and separating between base substrate 102 and cap layer 114. Base substrate 103 may be formed of any suitable material, for example a semiconductive material, for example, Silicon. Protrusions 104 may be formed of any suitable material, for example, an insulating material, for example, Silicon Oxide. Although the present invention is not limited in this regard, in exemplary embodiments of the present invention protrusions 104 may have a thickness of between 0.05 and 10 micrometers.

According to other embodiments, base substrate 102 and protrusions 104 may be integrally formed, for example, from Silicone.

According to exemplary embodiments of the invention, membrane 112 may be formed of any suitable material, for example, Aluminum Nitride, which may be suitable for FBAR devices, any other piezoelectric material, for example, Zinc Oxide, or any other suitable material. Although the present invention is not limited in this regard, in exemplary embodiments of the present invention membrane 112 may have a thickness of between 0.05 and 100 micrometers. Furthermore, in embodiments of the present invention, membrane 112 may be constructed in any suitable shape or form, and may include any suitable components, as may be required in accordance with specific implementations and/or designs.

According to exemplary embodiments of the invention, cap layer 114 may be formed of a selectively permeable material, for example, Aluminum Nitride, which may be permeable only to certain materials under predetermined conditions, for example, as described below.

According to some exemplary embodiments of the invention, cap layer 114 may be formed of a piezoelectric material, for example, Aluminum Nitride or Zinc Oxide, similar to the material of membrane 112. However, according to other embodiments cap layer 114 may be formed of any other suitable material e.g., similar to or different than the material of membrane 112.

Conductors 106 and/or 110 may be formed of any suitable conductive material, for example, Aluminum. In an embodiment of the present invention, conductors 106 and/or 110 may be used, for example, to electrically connect device 100 to other components and/or circuits of a device and/or a system incorporating device 100, using electrical contacts (not shown), vias 108 and/or other conducting elements (not shown). Vias 108 may include any suitable conductive, for example, metallic, via.

It will be appreciated by persons skilled in the art that, in exemplary embodiments of the present invention, sealed cavity 116 may be isolated, i.e., fluidically disconnected, from the environment, for example, the environment surrounding device 101.

Accordingly, it will be appreciated by persons skilled in the art, that cavity 116 may be protected from undesired conditions of the environment, for example, humidity, in contrast to conventional unsealed cavities which are fluidically connected to the environment, for example, via one or more release holes.

It will also be appreciated by persons skilled in the art that, although the above description with reference to the schematic illustration of FIG. 1 may depict a generally planar MEMS device and/or components placed generally parallel to each other, the present invention is not limited in this regard. Embodiments of the present invention may include MEMS devices that are not planar, and/or components that are not parallel or generally parallel to each other.

Figure 2:
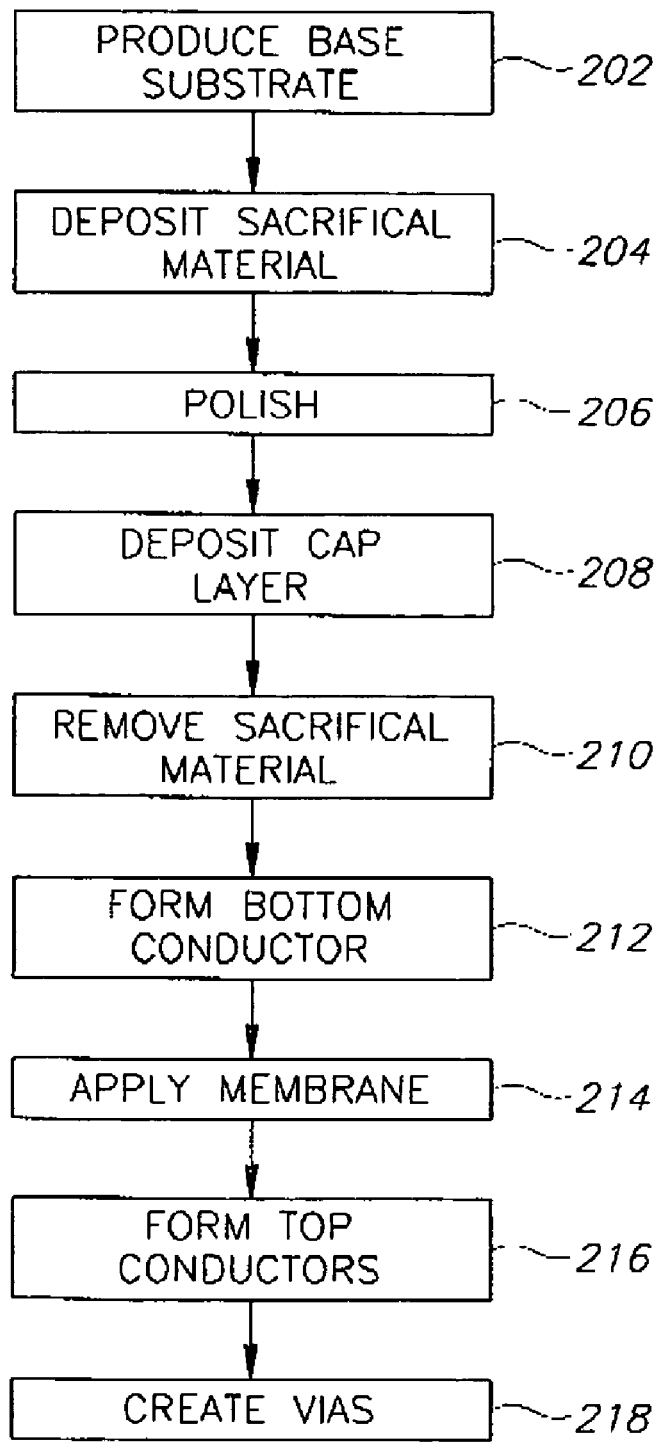
FIG. 2 is a schematic flowchart depicting a process for producing a MEMS device in accordance with exemplary embodiments of the present invention.

Reference is made to FIG. 2, which schematically illustrates a flowchart of a process for producing a MEMS device, for example, device 100 (FIG. 1) according to exemplary embodiments of the invention, and to FIGS. 3A–3I, which schematically illustrate exemplary stages in the process of FIG. 2 and exemplary components useful in understanding the process.

Although the present invention is not limited in this regard, the term "producing" as used herein with reference to an item, may be understood to include, inter alia, manufacturing or assembling the item, providing a pre-fabricated item, or processing a partly formed item.

Figure 3A:
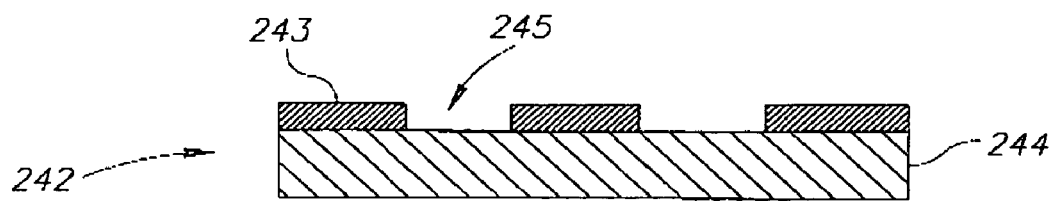
FIGS. 3A–3I are schematic illustrations of a MEMS device at different stages in the process of FIG. 2.

According to exemplary embodiments of the invention, the process may include producing a base structure including one or more recesses, as indicated at block 202 of FIG. 2. As shown in FIG. 3A, according to some exemplary embodiments of the invention, a base structure 242 may include one or more recesses 245 formed between two or more protrusions 243, for example, formed of silicon Oxide, attached to a base substrate 244, for example, formed of a semiconductive material, for example, Silicon. Producing the base structure may include depositing a layer of, for example, Silicone Oxide onto base substrate 244, for example, using any suitable method, for example, a Plasma Enhanced Chemical Vapor Deposition (PECVD) method or a sputtering method, as are known in the art. Producing the base structure may also include forming recesses 245 using any material removing method, for example, any suitable photolithographic and/or etching process, for example, a dry etching process, as are known in the art.

Figure 3B:
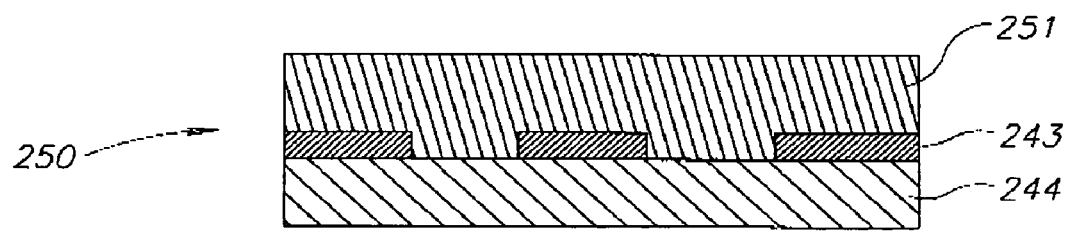

As indicated at block 204 of FIG. 2, the process may also include depositing a layer of a sacrificial material onto base structure 242, for example, using a suitable spin coating process, as is known in the art. According to some exemplary embodiments of the invention, the sacrificial material may include the Unity™ sacrificial polymer available from Promerus Electronic Materials of Ohio, USA, or any other suitable sacrificial material, e.g. polymer. As shown in FIG. 3B, a resulting part 250 of the above operations may include a layer 251 of the sacrificial material filling recesses 245. Layer 251 may additionally cover at least some of protrusions 243. According to exemplary embodiments of the invention, the process may also include performing a solvent flash process including, for example, heating part 250 to a temperature of approximately 100° C. for approximately 5 seconds, for example, by placing part 250 on a hotplate. The process may also include performing a cure process, for example, as is known in the art, to prevent oxidation of layer 251. The cure process may include, for example, heating part 250, for example, in a $N_2$ atmosphere, to a temperature of approximately 300° C. for approximately two hours.

Figure 3C:
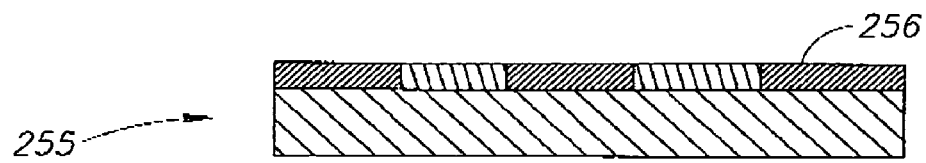

As indicated at block 206 of FIG. 2, the process may further include removing an excess part of layer 251 above protrusions 243, for example, using any suitable polishing method as is known in the art As shown in FIG. 3C, a resulting part 255 of the above operations may include base structure 242 having recesses 245 substantially filled with the sacrificial material and having substantially none of the sacrificial material on a top surface 256 of part 255.

Figure 3D:
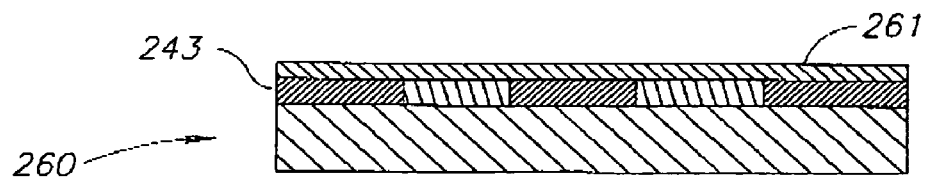

As indicated at block 208 of FIG. 2, the process may continue with depositing a cap layer on top of part 255, for example, using a suitable deposition process, as is known in the art. According to some exemplary embodiments of the invention, the cap layer may be formed of a generally non-permeable material, which may be selectively permeable to the sacrificial material under predetermined conditions, for example, of temperature and/or pressure as described below. For example, the cap layer may be formed of Aluminum Nitride or Zinc Oxide. As shown in FIG. 3D, a resulting part 260 of the above operations may include a cap layer 261 attached to protrusions 243 such that the sacrificial material is encapsulated between layer 261 and base structure 242.

Figure 3E:
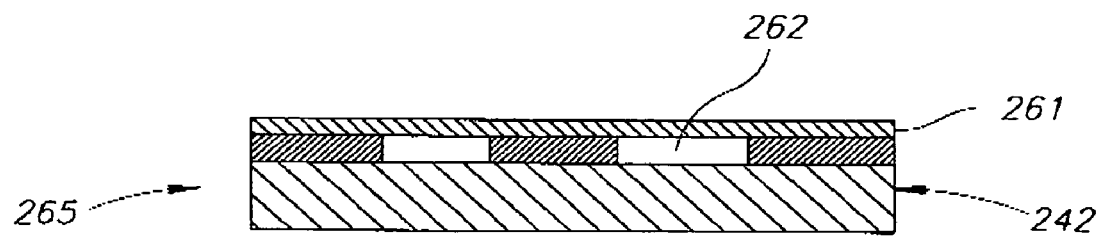

As indicated at block 210 of FIG. 2, the process may continue with removing the sacrificial material encapsulated between layer 261 and base structure 242. In exemplary embodiments of the present invention, removing the sacrificial material may include causing at least part of the sacrificial material to permeate through selectively permeable cap layer 261. Although the present invention is not limited in this regard, causing at least part of the sacrificial material to permeate through the cap layer may include, for example, heating part 260. For example, part 260 may be placed in a furnace, for example, a Nitrogen or Hydrogen Quartz tube furnace as is known in the art, at a temperature suitable for transforming the sacrificial material into a gaseous form. For example, part 260 may be heated to a temperature of approximately 400° C. if a Unity™400 sacrificial polymer is used. It will be appreciated that any other suitable methods may be implemented for removing at least most of the sacrificial material, for example, if a different sacrificial material, cap layer and/or base substrate are used. As shown in FIG. 3E, a resulting support structure 265 of the above operations may include one or more sealed cavities 262 encapsulated between cap layer 261 and base structure 242.

Figure 3F:
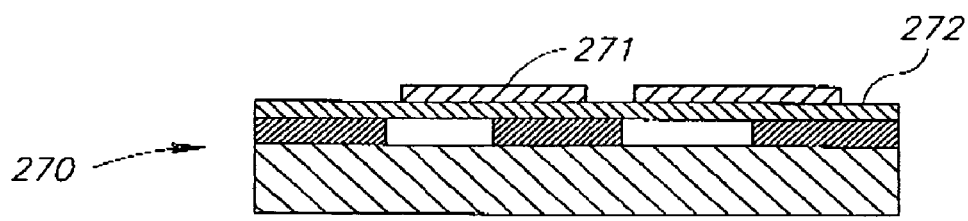

As indicated at block 212 of FIG. 2, the process may continue with forming at least one bottom conductor 271 on a top surface 272 of support structure 265. Forming the at least one conductor may include using any depositing and/or patterning methods, for example, sputtering, etching and/or photolithography, as are known in the art. As shown in FIG. 3F, a resulting part 270 of the above operations may include at least one conductor 271 attached to surface 272.

Figure 3G:
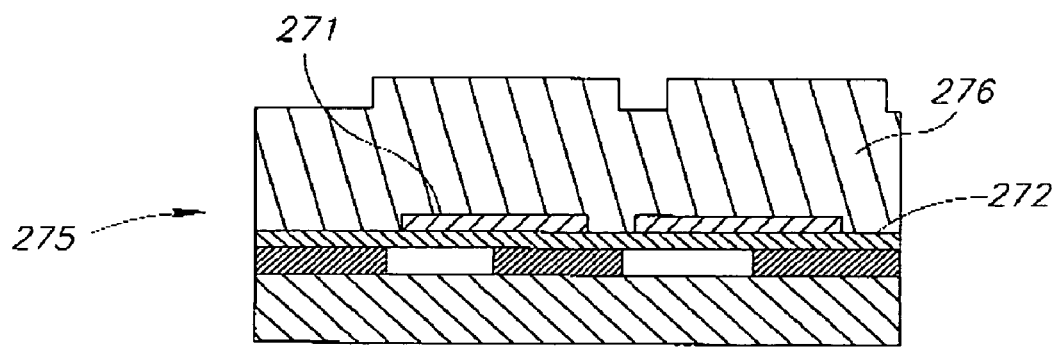

As indicated at block 214 of FIG. 2, the process may continue with applying a membrane 276 to surface 272. The membrane may be applied using any depositing and/or patterning methods, as are known in the art. As shown in FIG. 3G, a resulting part 275 of the above operations may include membrane 276 attached to surface 272.

Figure 3H:
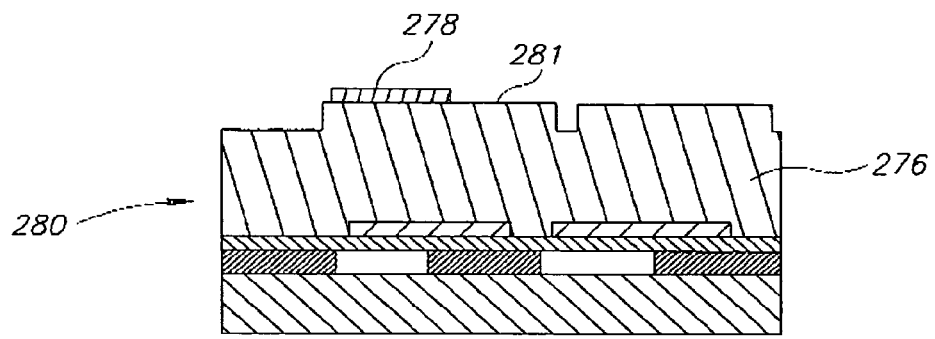

As indicated at block 216 of FIG. 2, the process may continue with forming at least one top conductor 278 on top of a surface 281 of membrane 276. The at least one conductor may be formed using any depositing and/or patterning methods, for example, sputtering, etching and/or photolithography, as are known in the art. As shown in FIG. 3H, a resulting part 280 of the above operations may include at least one conductor 278 attached to membrane 276.

Figure 3I:
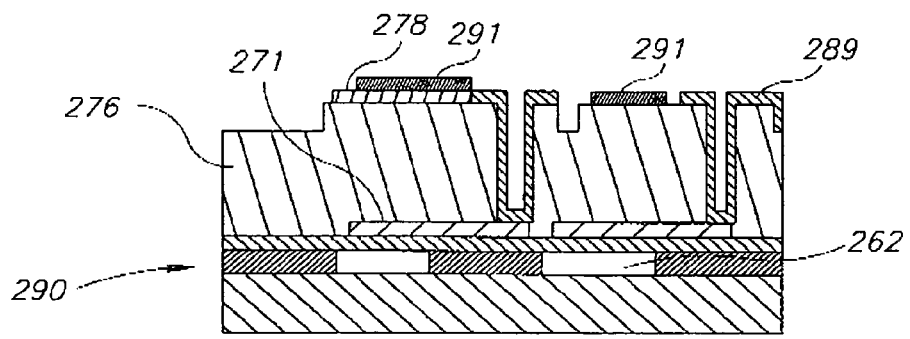

As indicated at block 218 of FIG. 2, the process may continue with creating at least one via 289 in membrane 276, for example, using any suitable method, as is known in the art. According to some exemplary embodiments, one or more conductors 291 may be formed on top of conductors 278 and/or on top of surface 281, for example, after creating vias 289. As shown in FIG. 3I, a resulting MEMS device 290 of the above operations may include conductors 271, 278 and/or 291 associated with, for example, at least partially attached to, membrane 276.

It will be appreciated that sealed cavities 262 may be isolated from the environment surrounding device 290.

It is noted that embodiments of the present invention may include units and/or sub-units, which may be separate of each other or combined together, and may be implemented using specific, multi-purpose or general devices as known in the art.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. An apparatus comprising:
   a base structure; and
   a cap layer attached to a top surface of said base structure and able to support one or more elements of an electromechanical device,
   wherein one or more cavities encapsulated between said base structure and said cap layer are sealed from an external environment,
   and wherein said cap layer comprises piezoelectric material.

2. The apparatus of claim 1, wherein said base structure comprises one or more protrusions attached to a base substrate, and wherein said one or more cavities are encapsulated between said cap layer, said base substrate and said protrusions.

3. The apparatus of claim 2, wherein said one or more protrusions comprise an insulating material.

4. The apparatus of claim 2, wherein said base substrate comprises a semiconductive material.

5. The apparatus of claim 1, wherein said one or more elements comprises a membrane.

6. The apparatus of claim 5, wherein said membrane comprises piezoelectric material.

7. The apparatus of claim 5, wherein said membrane comprises Aluminum Nitride.

8. The apparatus of claim 1, wherein said cap layer comprises a selectively permeable material.

9. The apparatus of claim 8, wherein said selectively permeable material is permeable when subject to a predetermined condition.

10. The apparatus of claim 1, wherein said electromechanical device comprises a Micro-Electro-Mechanical Systems device.

11. The apparatus of claim 1, wherein said cap layer comprises Aluminum Nitride.

12. The apparatus of claim 1, comprising a Film Bulk Acoustic Resonator filter.

13. A Micro-Electro-Mechanical Systems device comprising:
   a membrane attached to a support structure having one or more sealed cavities,
   wherein said support structure comprises:
      a base structure; and
      a cap layer having a first side attached to said base structure and a second side attached to said membrane, said cap layer comprising piezoelectric material;
   wherein said one or more sealed cavities are encapsulated between said base structure and said cap layer.

14. The device of claim 13, wherein said base structure comprises one or more protrusions attached to a base substrate, and wherein said one or more cavities are encapsulated between said cap layer, said base substrate and said protrusions.

15. The device of claim 13, wherein said cap layer comprises a selectively permeable material.

16. The device of claim 15, wherein said selectively permeable material is permeable when subject to a predetermined condition.

17. The device of claim 13, wherein said membrane comprises piezoelectric material.

18. The device of claim 13, wherein said membrane comprises Aluminum Nitride.

* * * * *